(12) United States Patent
Boerstler et al.

(10) Patent No.: US 7,358,785 B2
(45) Date of Patent: Apr. 15, 2008

(54) APPARATUS AND METHOD FOR EXTRACTING A MAXIMUM PULSE WIDTH OF A PULSE WIDTH LIMITER

(75) Inventors: David W. Boerstler, Round Rock, TX (US); Eskinder Hailu, Austin, TX (US); Jieming Qi, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 35 days.

(21) Appl. No.: 11/278,842

(22) Filed: Apr. 6, 2006

(65) Prior Publication Data

US 2007/0236266 A1    Oct. 11, 2007

(51) Int. Cl.
*H03K 3/017* (2006.01)
(52) U.S. Cl. ...................................... 327/172; 327/173
(58) Field of Classification Search .................... None
See application file for complete search history.

(56) References Cited

U.S. PATENT DOCUMENTS

| | | | |
|---|---|---|---|
| 3,586,884 A | 6/1971 | Gassmann | |
| 3,594,733 A | 7/1971 | Lukens, II | |
| 3,638,045 A | 1/1972 | Hughes | |
| 3,831,098 A | 8/1974 | Fletcher et al. | |
| 4,245,167 A | 1/1981 | Stein | |
| 4,305,010 A | 12/1981 | Wise | |
| 4,334,243 A | 6/1982 | Srivastava | |
| 4,881,040 A | 11/1989 | Vaughn | |
| 5,268,594 A | 12/1993 | Huang | |
| 5,309,034 A | 5/1994 | Ishibashi | |
| 5,309,456 A | 5/1994 | Horton | |
| 5,396,110 A * | 3/1995 | Houston | 327/172 |
| 5,566,129 A * | 10/1996 | Nakashima et al. | 365/233.5 |
| 5,672,990 A * | 9/1997 | Chaw | 327/176 |
| 5,761,151 A * | 6/1998 | Hatakeyama | 365/233.5 |
| 5,789,958 A | 8/1998 | Chapman et al. | |
| 5,875,152 A * | 2/1999 | Liu et al. | 365/233.5 |
| 5,929,684 A | 7/1999 | Daniel | |
| 5,969,555 A * | 10/1999 | Suda | 327/172 |
| 6,060,922 A | 5/2000 | Chow et al. | |

(Continued)

OTHER PUBLICATIONS

U.S. Appl. No. 11/109,090, filed Apr. 19, 2005, Boerstler et al.

(Continued)

*Primary Examiner*—Cassandra Cox
(74) *Attorney, Agent, or Firm*—Stephen R. Tkacs; Stephen J. Walder, Jr.; D'Ann N. Rifai

(57) ABSTRACT

An apparatus and method for extracting a maximum pulse width of a pulse width limiter are provided. The apparatus and method of the illustrative embodiments performs such extraction using a circuit that is configured to eliminate the majority of the delay cells utilized in the circuit arrangement described in commonly assigned and co-pending U.S. patent application Ser. No. 11/109,090 (hereafter referred to as the '090 application). The elimination of these delay cells is made possible in one illustrative embodiment by replacing an OR gate in the circuit configuration of the '090 application with an edge triggered re-settable latch. The replacement of the OR gate with the edge triggered re-settable latch reduces the amount of chip area used in addition to the power consumption of the circuit.

10 Claims, 4 Drawing Sheets

U.S. PATENT DOCUMENTS

| | | |
|---|---|---|
| 6,069,508 A | 5/2000 | Takai |
| 6,084,482 A * | 7/2000 | Nakamura .................. 331/44 |
| 6,356,129 B1 * | 3/2002 | O'Brien et al. ............. 327/175 |
| 6,486,722 B2 | 11/2002 | Yamauchi |
| 6,661,271 B1 * | 12/2003 | Burdick et al. ............. 327/269 |
| 6,918,050 B2 | 7/2005 | Yoshikawa et al. |
| 6,937,075 B2 * | 8/2005 | Lim et al. .................. 327/157 |
| 6,973,145 B1 * | 12/2005 | Smith et al. ................ 375/354 |
| 2001/0011913 A1 | 8/2001 | Sher |
| 2003/0102896 A1 | 6/2003 | Porter et al. |
| 2005/0010885 A1 | 1/2005 | Aipperspach et al. |
| 2005/0035801 A1 | 2/2005 | Weiner |
| 2005/0091620 A1 | 4/2005 | Aipperspach et al. |
| 2006/0232310 A1 | 10/2006 | Boerstler et al. |

OTHER PUBLICATIONS

Rabaey, Jan M., "Digitalintegrated Circuits—A Design Perspective", Prentice Hall (1996), Chapter 4, p. 193, Example 4.1.

Katz, Randy H. "Contemporary Logic Design", Benjamin/Cummings Publishing Company, Inc., Redwood City, CA (1994), pp. 138-139.

* cited by examiner

APPARATUS AND METHOD FOR EXTRACTING A MAXIMUM PULSE WIDTH OF A PULSE WIDTH LIMITER

BACKGROUND

1. Technical Field

The present application relates generally to the field of circuit design and testing. More specifically, the present application is directed to an apparatus and method for extracting a maximum pulse width of a pulse width limiter.

2. Description of Related Art

In many modern computer applications, especially those dealing with large arrays, the maximum pulse width of clock signals operating on these arrays needs to be limited. If the pulse width is too wide, for example, it can cause pre-charged array nodes to lose their logic value and result in array failure. Thus, it is common for a clock source to be pulse-width limited before being asserted onto array grids. One example of a technique for limiting the maximum pulse width of a clock source is described in commonly assigned and co-pending U.S. Patent Application Publication No. 2005/0091620 entitled "A Simplified Method for Limiting Clock Pulse Width," filed on Oct. 23, 2003.

One important issue that needs to be addressed is the off-chip characterization of such a pulse width limiter circuit under typical bandwidth-limited laboratory conditions. For example, a pulse-width limiter with a maximum allowable pulse width of 100 picoseconds (ps) will have significant power at around 1/100 ps (10 GHz). However, typical laboratory equipment that can guarantee signal integrity at such frequencies is often cost-prohibitive.

One possible solution for avoiding such cost-prohibitive laboratory equipment arrangements is to use on-chip characterization of the pulse-width limiter output. This can be accomplished, for example, by sampling the pulse-width limiter output with various phases of a voltage-controlled oscillator (VCO) input. However, this approach relies on the discrete phases available from the VCO and, therefore, the discreteness limits the resolution of this technique. Moreover, unless the VCO is locked by, for example, a phase-locked loop (PLL), the VCO input can be compromise by large jitter at each of its phases, thereby increasing the measurement uncertainty.

An alternative approach is to employ pulse stretcher circuitry. Pulse stretchers are used to extend or stretch the output of, for example, a pulse-width limiter to thereby reduce the bandwidth requirement of the laboratory measurement equipment. This approach, however, is also subject to limitations. In particular, the precise magnitude of the pulse extension caused by the pulse stretchers must be known, which thereby requires characterization of the pulse stretchers' performance itself. Thus, while one can employ the pulse stretchers to bring the test output within the bandwidth requirement of the off-chip laboratory measurement equipment, the desired measurement remains unknown without an often complicated additional characterization of the pulse stretchers themselves.

As a further alternative, in commonly assigned and co-pending U.S. patent application Ser. No. 11/109,090 entitled "System and Method for On/Off-Chip Characterization of Pulse-Width Limiter Outputs," filed Apr. 19, 2005, describes a circuit capable of extracting the maximum pulse width of a pulse width limiter. With the circuit described in the '090 application, the outputs of cascaded pulse width limiters are delayed by a fixed amount and then combined through an OR gate. The output of the OR gate is then a wide pulse that may be characterized by limited bandwidth laboratory measurement equipment.

As mentioned above, in the exemplary circuit arrangements set forth in the '090 application, the outputs of the pulse width limiters are delayed by a fixed amount prior to being combined at the OR gate. The delay cells required for providing this fixed amount of delay consume a large chip area and may also consume a large amount of power.

SUMMARY

The illustrative embodiments described herein provide an apparatus and method for extracting the maximum pulse width of a pulse width limiter. The apparatus and method of the illustrative embodiments performs such extraction using a circuit that is configured to eliminate the majority of the delay cells utilized in the circuit arrangement described in commonly assigned and co-pending U.S. patent application Ser. No. 11/109,090 (hereafter referred to as the '090 application). The elimination of these delay cells is made possible in one illustrative embodiment by replacing an OR gate in the circuit configuration of the '090 application with an edge triggered re-settable latch. The replacement of the OR gate with the edge triggered re-settable latch reduces the amount of chip area used in addition to the power consumption of the circuit.

In one illustrative embodiment, a method is provided for determining a maximum pulse width of a pulse width limiter. The method may be implemented, for example, in a pulse width limiter output characterization device. The method may comprise receiving an input signal, limiting a pulse width of the received input signal to generate a first intermediate signal, delaying the first intermediate signal by a known amount to generate a set signal, asserting a clock output signal in response to assertion of the set signal, and de-asserting the clock output signal in response to a receipt of a reset signal. The asserted clock output signal may be representative of the maximum pulse width of the pulse width limiter. The known amount by which the intermediate signal is delayed may be $(N-1)\tau$, where N is a number of pulse width limiters in the plurality of pulse width limiters, and $\tau$ is a fixed amount of time by which a rising edge of the input signal is delayed by the first pulse width limiter.

The pulse width limiter output characterization device may have a plurality of pulse width limiters arranged in series to thereby provide a series of pulse width limiters. A first pulse width limiter may limit the pulse width of the received known clock signal to generate the first intermediate signal. A last pulse width limiter in the plurality of pulse width limiters may output the reset signal.

A delay circuit element associated with the first pulse width limiter may delay the first intermediate signal by the known amount to generate the set signal. In one illustrative embodiment, only the first pulse width limiter in the plurality of pulse width limiters has an associated delay circuit element.

The clock signal may be asserted by a re-settable latch in response to the re-settable latch receiving the set signal. The clock signal may be de-asserted by the re-settable latch in response to receiving the reset signal. The re-settable latch may be an edge triggered re-settable latch.

Each pulse width limiter in the plurality of pulse width limiters, with the exception of the last pulse width limiter, may have an associated inverter that inverts an output of the associated pulse width limiter. The inverters may provide the inverted output as an input to a next pulse width limiter in the series of pulse width limiters.

The assertion of the clock output signal may have a pulse width of $NT_{max}$, where N is a number of pulse width limiters in the plurality of pulse width limiters and $T_{max}$ is a maximum pulse width of the pulse width limiters. The method may further comprise determining a maximum pulse width for a pulse width limiter by dividing the pulse width of the asserted clock output signal by the number of pulse width limiters in the plurality of pulse width limiters.

In a further illustrative embodiment, an apparatus for determining a maximum pulse width of a pulse width limiter is provided. The apparatus may comprise at least one pulse width limiter, a delay circuit element coupled to the at least one pulse width limiter, and an output clock generation circuit element coupled to the delay circuit element. The at least one pulse width limiter may receive an input signal and may limit a pulse width of the received input signal to generate a first intermediate signal. The delay circuit element may delay the first intermediate signal by a known amount to generate a set signal. The output clock generation circuit element may assert a clock output signal in response to assertion of the set signal and may de-assert the clock output signal in response to a receipt of a reset signal. The asserted clock output signal may be representative of the maximum pulse width of the pulse width limiter. The known amount by which the intermediate signal is delayed may be $(N-1)\tau$, where N is a number of pulse width limiters in the plurality of pulse width limiters, and $\tau$ is a fixed amount of time by which a rising edge of the input signal is delayed by the first pulse width limiter.

The at least one pulse width limiter may comprise a plurality of pulse width limiters arranged in series to thereby provide a series of pulse width limiters. A first pulse width limiter may limit the pulse width of the received known clock signal to generate the first intermediate signal. A last pulse width limiter in the plurality of pulse width limiters may output the reset signal.

The delay circuit element may be associated with the first pulse width limiter. In one illustrative embodiment, only the first pulse width limiter in the plurality of pulse width limiters has an associated delay circuit.

The output clock generation circuit element may be a re-settable latch. The re-settable latch may be an edge triggered re-settable latch.

Each pulse width limiter in the plurality of pulse width limiters, with the exception of the last pulse width limiter, may have an associated inverter that inverts an output of the associated pulse width limiter. The inverters may provide the inverted output as an input to a next pulse width limiter in the series of pulse width limiters.

The assertion of the clock output signal may have a pulse width of $NT_{max}$, where N is a number of pulse width limiters in the plurality of pulse width limiters and $T_{max}$ is a maximum pulse width of the pulse width limiters. A maximum pulse width for a pulse width limiter may be determined by dividing the pulse width of the asserted clock output signal by the number of pulse width limiters in the plurality of pulse width limiters.

These and other features and advantages will be described in, or will become apparent to those of ordinary skill in the art in view of, the following detailed description of the illustrative embodiments.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENTS

Figure 1:
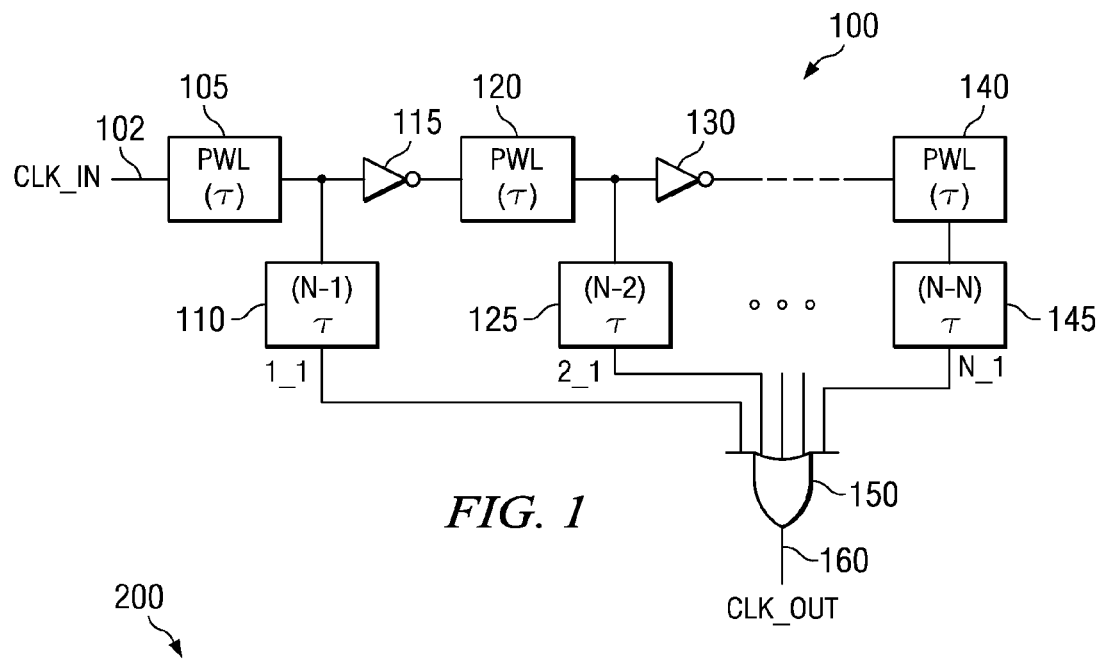
FIG. 1 is a block diagram depicting a pulse-width limiter output characterization system in accordance with the illustrative embodiments described in U.S. patent application Ser. No. 11/109,090.
Figure 2:
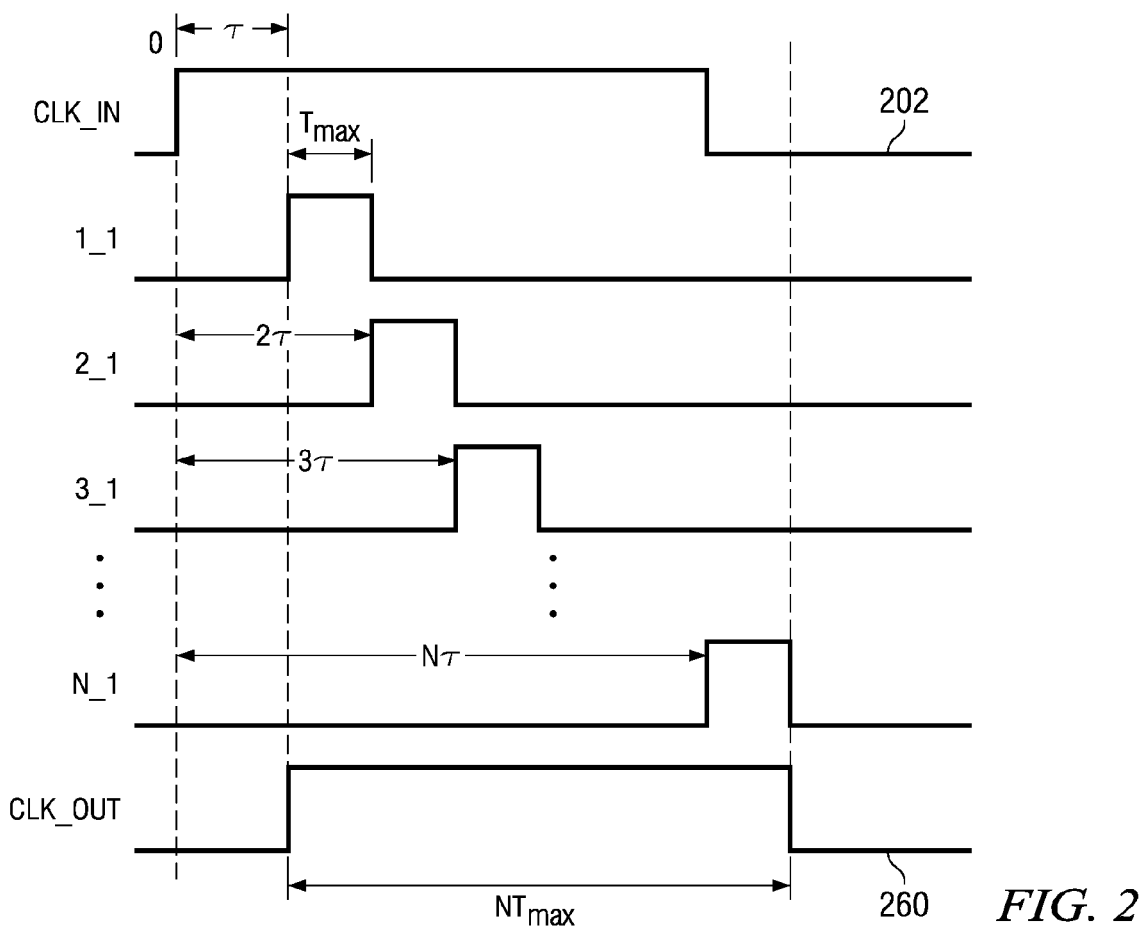
FIG. 2 illustrates a plurality of exemplary waveforms for a pulse-width limiter output characterization system in accordance with the illustrative embodiments described in U.S. patent application Ser. No. 11/109,090.
Figure 3:
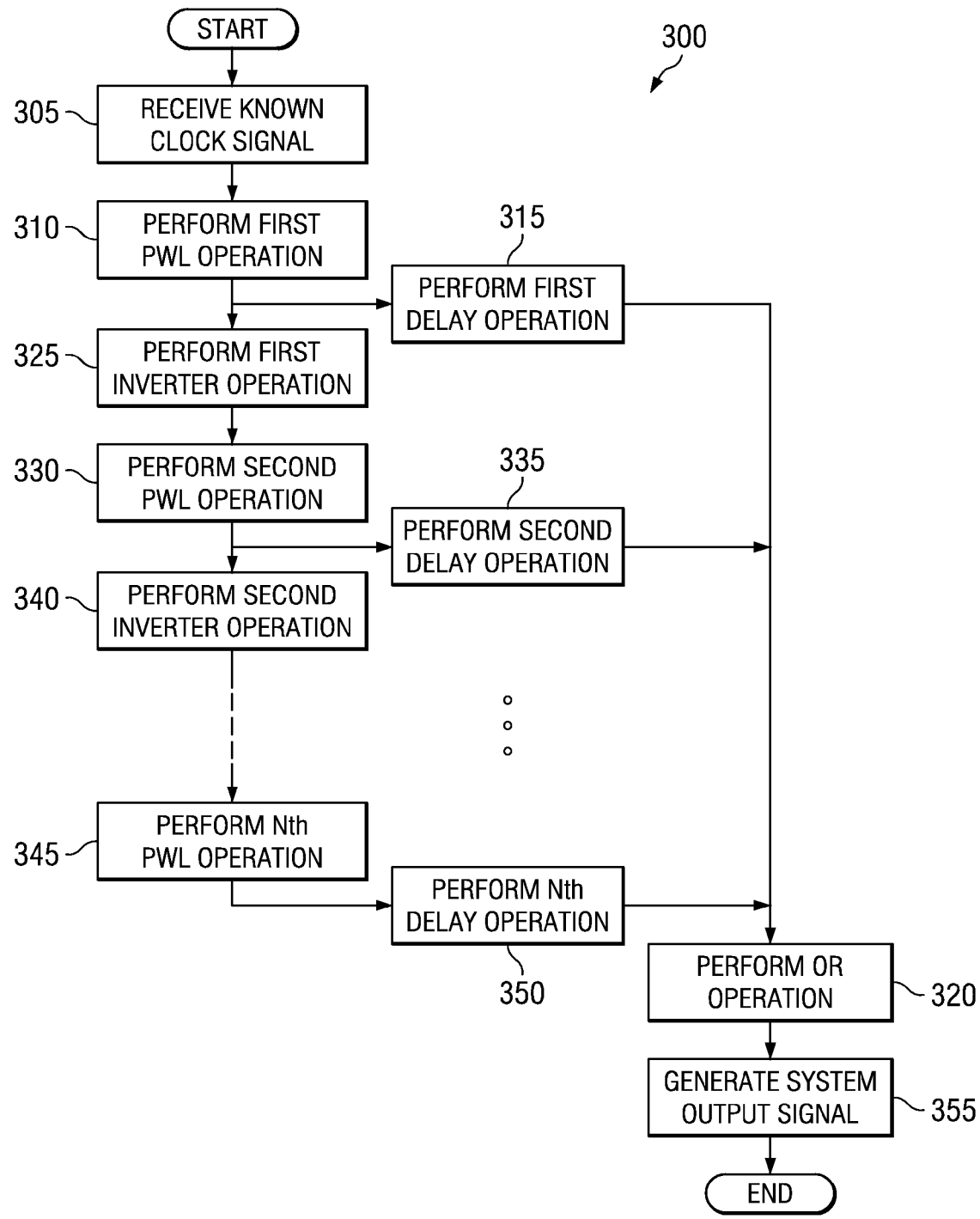
FIG. 3 is a flow diagram depicting a pulse-width limiter output characterization method in accordance with the illustrative embodiments described in U.S. patent application Ser. No. 11/109,090.

The mechanisms of the illustrative embodiments make improvements over the mechanisms of the illustrative embodiments in U.S. patent application Ser. No. 11/109,090 (hereafter referred to as the '090 application). Thus, in order to best understand the improvements provided by the illustrative embodiments, it is first beneficial to provide a description of the mechanisms of the illustrative embodiments set forth in the '090 application. FIGS. 1-3 hereafter provide illustrative examples of the mechanisms described in the '090 application.

FIG. 1 is an exemplary block diagram depicting a pulse-width limiter output characterization system 100 in accordance with the illustrative embodiments described in the '090 application. As shown in FIG. 1, the pulse-width limiter output characterization system 100 includes a pulse-width limiter (PWL) 105 which is one or more circuits, or other suitable logic, that is configured to perform pulse-width limiting operations. In one illustrative embodiment, the PWL 105 is configured to receive an input signal and to limit a pulse width of the received input signal. In the illustrated embodiment, the PWL 105 is configured to receive a clock signal, e.g., CLK_IN 102, and to limit the pulse width of the received CLK_IN signal 102, to generate an intermediate signal. Generally, the pulse width of the output of the PWL 105, i.e. the intermediate signal, is smaller than the pulse width of the received CLK_IN signal 102. One object of the PWL output characterization system 100 is to aid in identifying the characteristics of the output of the PWL 105 as compared to the input signal.

In one illustrative embodiment, the PWL 105 is configured to delay a rising edge of its input by a fixed amount of time and to combine the delayed rising edge with either a received falling edge or a fixed maximum pulse-width edge to generate an output pulse-width-limited signal. That is, where the input signal to the PWL 105 has a pulse width that is smaller than the maximum pulse width, the PWL 105 delays a rising edge of the output signal by a fixed amount of time from the input signal rising edge, and delays a falling edge of the output signal by a fixed amount of time from the input signal falling edge.

Where the input signal to the PWL 105 has a pulse width that is larger than the maximum pulse width, the PWL 105 delays a rising edge of the output signal by a fixed amount of time from the input signal rising edge, and delays a falling edge of the output signal to the maximum pulse width from the delayed rising edge. In the illustrated embodiment, the variable name "tau" ($\tau$) identifies the fixed amount of time by which the input signal rising edge is delayed.

PWL 105 is coupled to a delay circuit 110. The delay circuit 110 is one or more circuits, or other suitable logic, that is configured to receive an input signal and to generate a delayed signal based on the input signal and a predetermined time delay. In one illustrative embodiment, the delay circuit 110 is configured to generate a delayed signal with a rising edge that is delayed by a predetermined time delay from the input signal rising edge, i.e. the rising edge of the intermediate signal from the PWL 105, and a falling edge that is delayed by the same predetermined time delay from the input signal falling edge.

In one illustrated embodiment, the predetermined time delay is a function of $\tau$, i.e. the fixed amount of time by which the input signal, CLK_IN 102, rising edge is delayed by the PWL 105. In one illustrative embodiment, the delay circuit 110 is configured with a predetermined time delay of (N−1)$\tau$, where "N" represents the total number of pulse-width limiters employed in the PWL output characterization system 100. While the illustrative embodiment uses a time delay of (N−1)$\tau$, the present invention is not limited to such and one skilled in the art will understand that other configurations may also be employed without departing from the spirit and scope of the present invention. As described in more detail below, the output of the delay circuit 110 is an input to an OR gate 150.

The PWL 105 is also coupled to an inverter 115. The inverter 115 is one or more circuits, or other suitable logic, that is configured to receive an input signal and to generate an inverted signal based on the received input signal. In one illustrative embodiment, the inverter 115 is configured to receive the intermediate signal from the PWL 105 and generate an output signal that is the logical inverse of the received intermediate signal.

It should be noted that, for ease of illustration, FIG. 1 shows the latency introduced by each stage ($\tau$) as solely due to the PWLs 105, 120, and 140. In ordinary operations, however, the latency of each stage includes the latency introduced by the PWL 105, 120, and 140 and also the associated inverter 115 and 130 at the output of the PWL 105 and 120 (the PWL 140 does not have an associated inverter and thus, the latency would be due to latency of the PWL 140 alone). For ease of illustration, however, the following discussion assumes that the latency of the inverters 115 and 130 is bundled into $\tau$.

The inverter 115 is coupled to the PWL 120. The PWL 120, similar to the PWL 105, is one or more circuits, or other suitable logic, that is configured to perform pulse-width limiting operations. In one illustrative embodiment, in the illustrated embodiment, the PWL 120 is configured identically to PWL 105, although identical configuration of the PWLs 105, 120 and 140 is not required for operation of the present invention. Thus, as described in more detail below, the output of the PWL 105 passes through the inverter 115, whose output is then used as the input to the PWL 120. The system repeats this sequence N times in a chain where N PWL circuits are cascaded. Additionally, the output of the PWL 120 is a second intermediate signal, which, like the intermediate signal that is the output by the PWL 105, serves as the input for an inverter 130 and a delay circuit 125.

The delay circuit 125, like the delay circuit 110, is one or more circuits, or other suitable logic, that is configured to receive an input signal and to generate a delayed signal based on the input signal and a predetermined time delay. In one illustrative embodiment, the delay circuit 125 is configured to generate a delayed signal with a rising edge that is delayed by a predetermined time delay from the input signal, i.e. the inverted intermediate signal output by the PWL 105, rising edge, and a falling edge that is delayed by the same predetermined time delay from the input signal falling edge. In the illustrated embodiment, the delay circuit 125 is configured with a predetermined time delay of (N−2)$\tau$ although, as discussed above, different configurations may be utilized without departing from the spirit and scope of the present invention. As with the output of the delay circuit 110, the output of the delay circuit 125 is an input to OR gate 150.

The PWL 120 is also coupled to the inverter 130 which, like inverter 115, is one or more circuits, or other suitable logic, that is configured to receive an input signal and to generate an inverted signal based on the received input signal. In particular, the inverter 130 is configured to receive the intermediate signal from the PWL 120 and generate an output signal that is the logical inverse of the received intermediate signal. In the illustrated embodiment, the output of the inverter 130 serves as the input to the next PWL in the sequence. One skilled in the art will understand that the sequence continues as described above, with the input to each subsequent PWL being the output of the immediately upstream inverter, and the output of each subsequent PWL serving as the input to a downstream delay circuit.

Thus, the last inverter in the series is coupled to the Nth, and final, PWL of the PWL output characterization system 100, e.g., PWL 140, which, in the illustrative embodiment, is configured identically to the PWL 105 and the PWL 120. The PWL 140 is coupled to delay circuit 145 which is configured to generate a delayed signal with a rising edge that is delayed by a predetermined time delay from the input signal, i.e. the intermediate signal from the PWL 140, rising edge, and a falling edge that is delayed by the same predetermined time delay from the input signal falling edge. In the illustrated embodiment, delay circuit 145 is configured with a predetermined time delay of (N−N)$\tau$, or zero delay. As with the outputs of the delay circuits 110 and 125, the output of the delay circuit 145 is an input to OR gate 150.

Thus, generally, in the illustrated embodiment, an associated delay circuit delays the output of a particular PWL by a predetermined time delay of (N−X)$\tau$, where "N" represents the total number of PWLs in the PWL output characterization system 100 and "X" represents the ordinal rank or position of that particular PWL. Therefore, the delay circuit associated with the last (i.e. Nth) PWL, e.g., delay circuit 145 in the illustrated embodiment, is configured to delay the output of its associated PWL, e.g., PWL 140, by the predetermined time delay of (N−N)$\tau$, or zero delay. Accordingly, the last, or Nth, delay circuit may be omitted from the PWL output characterization system 100.

As described above, the PWL output characterization system 100 includes OR gate 150. The OR gate 150 is coupled to each delay circuit 110, 125, and 145, and receives as input the output of each delay circuit 110, 125, and 145, which in the illustrated embodiment is a plurality of delayed signals. The output of the OR gate 150 in the illustrated embodiment is a signal designated, "CLK_OUT 160."

Thus, generally, the PWL output characterization system 100 employs a cascade of pulse-width limiting circuits, and combines the outputs of each of the pulse-width limiting circuits to generate a system output pulse of arbitrary duration that can then be characterized using ordinary laboratory equipment. With this circuit arrangement, associated delay circuits delay the output of each PWL by a specific time delay. The resulting delayed output signals are combined together through a logic "OR" using OR gate 150 to generate a system output pulse. In one implementation of the circuitry shown in FIG. 1 having N PWLs and each PWL is configured to generate an intermediate signal with a maximum pulse width of $T_{max}$, the system output pulse will have a pulse width with a duration equal to $NT_{max}$.

For further illustration of the interaction of the components of the PWL output characterization system 100, FIG. 1 provides labels for the output signals of the delay circuits 110, 125 and 145, i.e. the delayed signals as described above. In particular, as shown in FIG. 1, the output signal of delay circuit 110 is denoted "1_1", the output signal of delay circuit 125 is denoted "2_1", and the output signal of delay circuit 145 is denoted "N_1." These labels will be used to further explain the illustrative embodiments with regard to the illustrative waveform analysis illustrated in FIG. 2.

FIG. 2 illustrates a plurality of exemplary waveforms for a pulse-width limiter output characterization system in accordance with the illustrative embodiments described in the '090 application. As shown in FIG. 2, in one illustrated embodiment, the CLK_IN signal 202 represents an input to the PWL output characterization system 100. As depicted, at time 0, the CLK_IN signal 202 is asserted or is transitioned to a logic high value. As described above, the CLK_IN signal 202 is the input to the PWL 105 in FIG. 1. Thus, at time NT, the output 1_1 from the delay circuit 110 of FIG. 1 is at a logic high state. That is, the PWL 105 introduces a delay of τ to generate an intermediate signal, i.e. a pulse-width-limited signal with a pulse width of $T_{max}$, which the delay circuit 110 further delays by a predetermined delay time of (N−1)τ to generate a delayed signal with a combined delay from time 0 of (N−1)τ+τ, or Nτ.

Similarly, the output 2_1 from the delay circuit 125 of FIG. 1 is at a logic high state at the falling edge of signal 1_1, i.e. at time Nτ plus the maximum pulse width of the PWL 105, $T_{max}$. As shown in the illustrated embodiment, the subsequent output signals 3_1 though N_1 together form a cascade of pulses to the OR gate 150. Thus, the output of the OR gate 150, i.e. CLK_OUT 260, is at a logic high state at time τ through time $τ+NT_{max}$, and has a pulse width of $NT_{max}$. Therefore, one can determine the maximum pulse width $T_{max}$ for each PWL through analysis of the CLK_OUT signal 260, by dividing the pulse width by N. i.e. the number of PWLs in the PWL output characterization system 100.

Thus, using the PWL output characterization system 100 of the illustrative embodiments, one can determine an accurate characterization of the outputs of a pulse-width limiter circuit using ordinary laboratory equipment. Furthermore, by stretching the pulse width of the CLK_OUT signal 260, the PWL output characterization system 100 may relax jitter and/or frequency requirements for on-chip sampling and characterization of the PWL output. For example, if one samples a single PWL with VCO phases that have minimum increments of δ, then one can describe the maximum on-chip characterization error of the PWL, expressed as a fraction of the maximum allowable pulse width $T_{max}$, as: $|Error|=δ/T_{max}$. However, where one cascades N PWLs, as in the PWL output characterization system 100, one can describe the error as: $|Error|=δ/(NT_{max})$. Accordingly, one can employ the PWL output characterization system 100 to improve on-chip PWL characterization accuracy by a factor of N.

FIG. 3 is a flow diagram depicting a pulse-width limiter output characterization method in accordance with the illustrative embodiments described in the '090 application. As shown in FIG. 3, the operation starts with the PWL output characterization system receiving a known clock signal (step 305). The PWL 105 of FIG. 1, for example, may perform this operation. A first pulse-width limiter performs a first pulse-width-limiting operation (step 310). Again, the PWL 105 of FIG. 1, for example, may perform this pulse-width-limiting operation.

A first delay circuit performs a first delay operation on the resultant signal of the first pulse-width-limiting operation of step 310 (step 315). The delay circuit 110 of FIG. 1, for example, may perform this first delay operation. In one embodiment, as described above, the first delay operation is based on a multiple of a delay associated with the first pulse-width-limiting operation of step 310. An OR gate, e.g., OR gate 150 in FIG. 1, performs a logic OR operation on the result of the first delay operation of step 315, and, as described in more detail below, the results of the delay operations performed in steps 335 and 350 (step 320). One skilled in the art will understand that one can perform step 320 contemporaneously with other steps and/or otherwise on a continuous basis.

A first inverter performs a first inverter operation on the resultant signal of the first pulse-width-limiting operation of step 310 (step 325). The inverter 115 of FIG. 1, for example, may perform this first inverter operation. A second pulse-width limiter performs a second pulse-width-limiting operation on the resultant signal of the first inverter operation of step 325 (step 330). The PWL 120 of FIG. 1, for example, may perform this second pulse-width-limiting operation. A second delay circuit performs a second delay operation on the resultant signal of the second pulse-width-limiting operation of step 330 (step 335). The delay circuit 125 of FIG. 1, for example, may perform this second delay operation.

A second inverter performs a second inverter operation on the resultant signal of the second pulse-width-limiting operation of step 330 (step 340). The inverter 130 in FIG. 1, for example, may perform this second inverter operation.

The results of this second pulse-width-limiting operation then serve as input to a subsequent stage including a delay operation, which results then serve as an input to the OR operation of step 320, and an inverter operation, which results then serve as an input to a subsequent pulse-width-limiting operation, and so forth. The process continues repeats through the Nth stage, where N is the number of pulse-width-limiting operations performed in the process.

An Nth pulse-width limiter performs an Nth pulse-width-limiting operation on the resultant signal of the immediately previous inverter operation (step 345). The PWL 140 of FIG. 1, for example, may perform this Nth pulse-width-limiting operation. An Nth delay circuit performs an Nth delay operation on the resultant signal of the pulse-width-limiting operation of step 345 (step 350). The delay circuit 145 of FIG. 1, for example, may perform this Nth delay operation.

As described above, at step 320, an OR gate 150 performs a logic "OR" operation on the resultant signals of the collective delay operations, that is, the delay operations of step 315, step 335, step 350, and any intermediate stages between step 340 and step 350. The OR gate, e.g., OR gate 150 in FIG. 1, generates a system output signal based on the logic "OR" operation of step 320 (step 355), and the process ends.

As mentioned previously above, while the circuit arrangement shown in FIG. 1 and the operation outlined in FIGS. 2-3 provide an excellent mechanism for characterizing the output of a pulse-width limiter, the need to include delay circuitry and the OR gate in the circuit arrangement significantly increases the chip area consumed by the circuitry and also increases the power consumed by the circuitry. The illustrative embodiments described hereafter seek to reduce the chip area and power consumed by the pulse-width limiter output characterization system by eliminating the OR gate and a majority of the delay elements in the circuit arrangement.

In particular, the illustrative embodiments herein replace the delay elements and the OR gate of the pulse-width limiter output characterization system shown in FIG. 1 with a single re-settable latch and a single delay element. The re-settable latch has a set input, a reset input, and a clock output. When the set input of the re-settable latch goes high, i.e. on the rising edge of the set input signal, the output of the latch is set high. When the reset input of the latch goes low, i.e. on the falling edge of the reset input signal, the output of the latch is reset, i.e. it becomes low. By arranging the circuit elements such that the set input signal corresponds to a delayed intermediate signal output by a first PWL in the pulse-width limiter output characterization system, and the reset input signal corresponds to an output of an Nth PWL in the pulse-width limiter output characterization, the output clock of the re-settable latch outputs a high signal for a same duration as the CLK_OUT signal 260 of FIG. 2, i.e. for a duration of $NT_{max}$.

Figure 4:
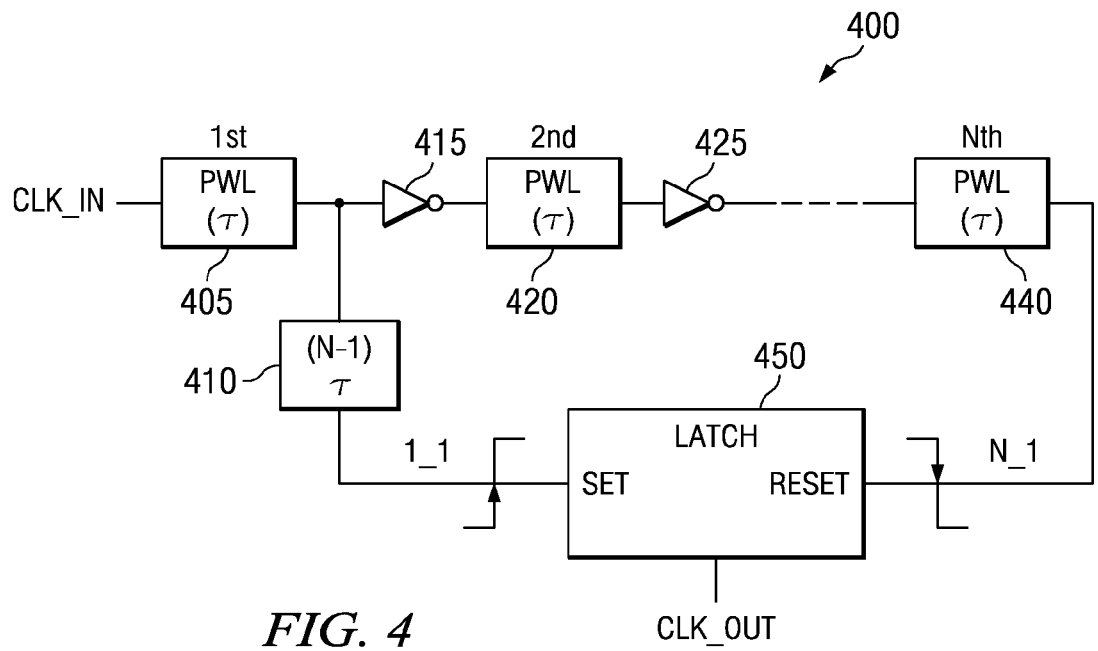
FIG. 4 is an exemplary diagram illustrating a pulse-width limiter output characterization system (hereafter referred to as the "PWL system") in accordance with one illustrative embodiment of the present invention.

FIG. 4 is an exemplary diagram illustrating a pulse-width limiter output characterization system (hereafter referred to as the "PWL system") in accordance with one illustrative embodiment of the present invention. As shown in FIG. 4, the PWL system 400 includes a plurality of PWLs 405, 420, and 440. Additional PWLs may be provided in the PWL system 400 such that PWL 440 is the Nth PWL of the PWL system 400 in a similar manner as previously described above with regard to FIG. 1. In addition, inverters 415, 425, and the like are provided between PWLs 405, 420 and 440 for inverting the output signals of the PWLs before providing them as inputs to the next stage of the pulse-width limiter output characterization system. These inverters 415 and 425 are similar to the inverters 115 and 130 in FIG. 1.

The output of the first PWL 405 is coupled to inverter 415 and to the delay circuit 410. The delay circuit 410 is similar to the delay circuit 110 in FIG. 1 and serves to delay the output signal, i.e. the delayed intermediate signal, from the first PWL 405 by a factor of $(N-1)\tau$. The output 1_1 of the delay circuit 410 is provided as a set input to the re-settable latch 450.

The output of the last PWL 440, i.e. the Nth PWL in the pulse-width limiter output characterization system, is provided as a reset input to the re-settable latch 450. The re-settable latch 450 provides an output CLK_OUT which may be used to characterize the output of the pulse-width limiter in a similar manner as described above with regard to CLK_OUT 260 in FIG. 2.

The re-settable latch 450 transitions the clock output signal CLK_OUT to a high state when the re-settable latch 450 is set, i.e. when the set input 1_1 is being asserted, i.e. is at a high state. The re-settable latch 450 transitions the clock output signal CLK_OUT to a low state when the re-settable latch 450 is reset, i.e. when the reset signal is asserted (i.e. at a high state), which is the output signal from the last PWL 440. Thus, when a known clock signal CLK_IN is input to the first PWL 405, the first PWL 405 delays the clock signal by a delay $\tau$. The PWL 405 generates a delayed intermediate signal that is input to inverter 415 and delay circuit 410. The delay circuit 410 delays the intermediate signal by a delay amount $(N-1)\tau$ thereby generating the output signal 1_1 which is the original clock signal CLK_IN delayed by N$\tau$. The output signal 1_1 is input to the re-settable latch 450 as the set input signal.

In response to receiving the assertion of the output signal 1_1 as the set input signal, the re-settable latch 450 asserts the clock output signal CLK_OUT. The re-settable latch 450 continues to assert the clock output signal CLK_OUT until the latch is reset by receiving an assertion of a reset signal input.

At substantially the same time, the intermediate signal output by the first PWL 405 passes through inverter 415 which inverts the signal and provides it as an input to the second PWL 420 which is configured to delay the inverted intermediate signal by a time delay value of $\tau$. This propagation of intermediate signals continues from stage to stage, wherein each stage comprises a PWL circuit element and an associated inverter, until the signal reaches the Nth PWL 440. After delaying the intermediate signal that is received as an input, the Nth PWL 440 outputs the delayed clock signal as a reset input signal N_1 to the re-settable latch 450. In response to receiving the assertion of the reset input signal N_1, the re-settable latch 450 resets the latch to a low state and thus, discontinues assertion of the clock output signal CLK_OUT.

Figure 5:
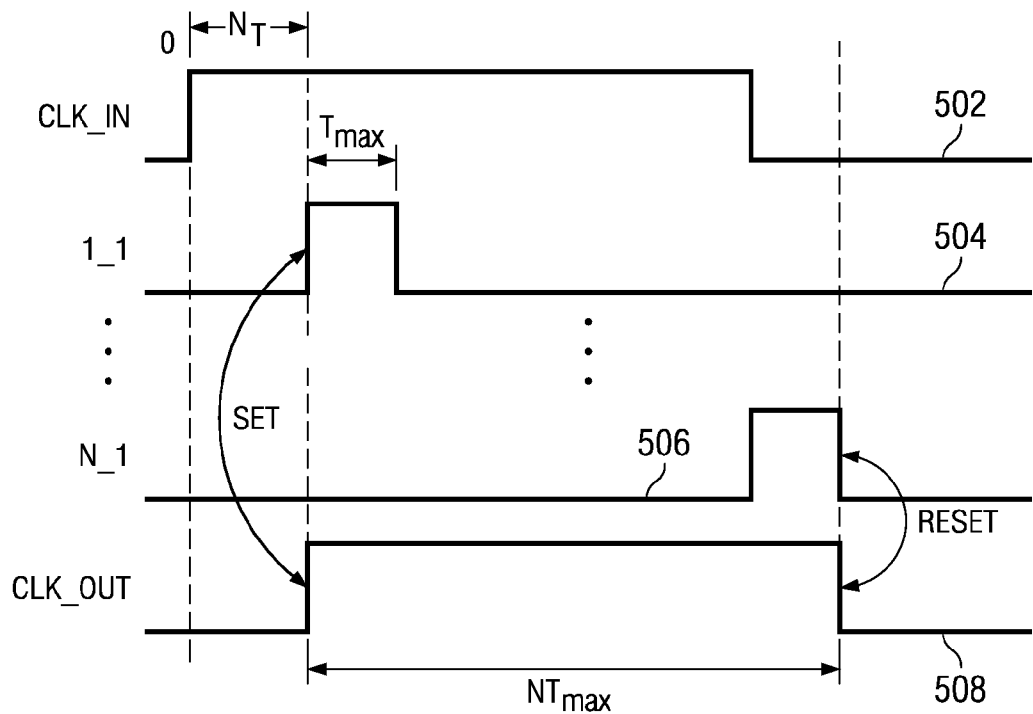
FIG. 5 illustrates a plurality of exemplary waveforms for a pulse-width limiter output characterization system in accordance with an illustrative embodiment of the present invention.

FIG. 5 illustrates a plurality of exemplary waveforms for a pulse-width limiter output characterization system in accordance with an illustrative embodiment of the present invention. As shown in FIG. 5, in one illustrated embodiment, the CLK_IN signal 502 represents an input to the PWL system 400. As depicted, at time 0, the CLK_IN signal 502 is asserted or is transitioned to a logic high value. As described above, the CLK_IN signal 502 is the input to the PWL 405 in FIG. 4, for example. Thus, at time N$\tau$, the output 1_1 504 from the delay circuit 410 of FIG. 4 is at a logic high state. That is, the PWL 405 introduces a delay of $\tau$ to generate an intermediate signal, i.e. a pulse-width-limited signal with a pulse width of $T_{max}$, which the delay circuit 410 further delays by a predetermined delay time of $(N-1)\tau$ to generate a delayed signal with a combined delay from time 0 of $(N-1)\tau+\tau$, or N$\tau$.

In response to the assertion of the output signal 1_1 504, i.e. at the rising edge of the output signal 1_1 504 which is the set input to the re-settable latch 450, the re-settable latch 450 asserts the clock output signal CLK_OUT 508. The assertion of the clock output signal CLK_OUT 508 continues for a time period $NT_{max}$ until the Nth PWL circuit, e.g., PWL 440 in FIG. 4, outputs the reset signal N_1 506. In response to the falling edge of the assertion of the reset signal N_1 506, the re-settable latch 450 resets the clock output signal CLK_OUT 508 to a low state.

Thus, as with the circuitry arrangement of FIG. 1, the output of the re-settable latch 450, i.e. CLK_OUT 508, is at a logic high state at time $\tau$ through time $\tau+NT_{max}$, and has a pulse width of $NT_{max}$. Therefore, one can determine the maximum pulse width $T_{max}$ for each PWL through analysis of the CLK_OUT signal 508, by dividing the pulse width by N, i.e. the number of PWLs in the PWL system 400. In this way, the PWL system 400 of the illustrative embodiments may be used to determine an accurate characterization of the outputs of a pulse-width limiter circuit using ordinary laboratory equipment. Furthermore, by stretching the pulse width of the CLK_OUT signal 508, the PWL system 400 may achieve the same benefits with regard to jitter, frequency requirements for on-chip sampling, and chip characterization accuracy as the PWL output characterization system of FIG. 1.

Figure 6:
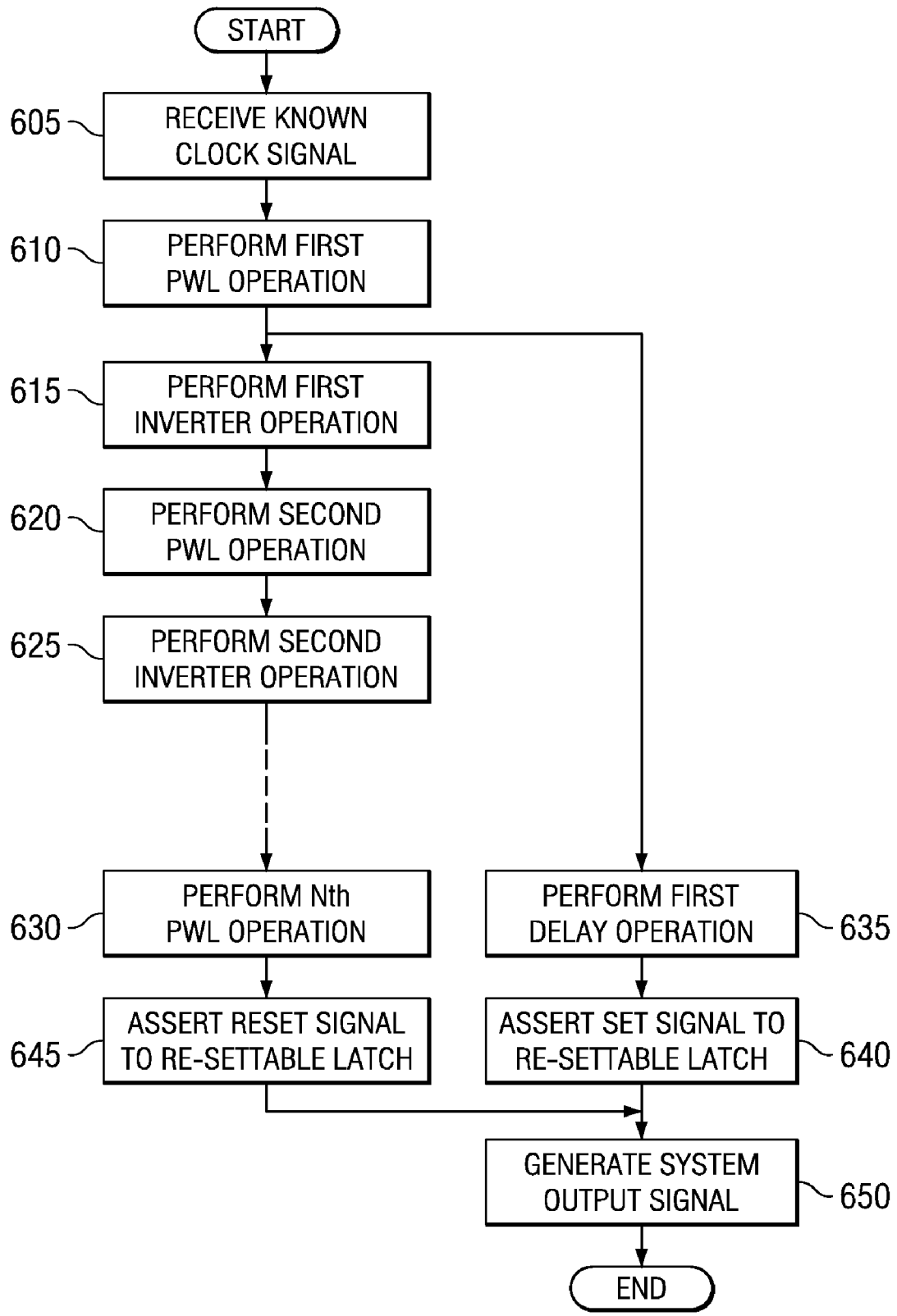
FIG. 6 is a flowchart outlining an exemplary operation of a PWL output characterization system in accordance with one illustrative embodiment.

FIG. 6 is a flowchart outlining an exemplary operation of a PWL output characterization system in accordance with one illustrative embodiment. The operations 605-635 are similar to steps 305, 310, 325, 330, 340 and 345 in FIG. 3 above and thus, a detailed explanation of these steps will not be provided herein. With regard to the improvements provided by the illustrative embodiments, as shown in FIG. 6, the delay operations 335 and 350, and any other delay operations depending upon the number of stages in the PWL output characterization system, are eliminated from the operation due to the ability to eliminate the delay circuits in the PWL output characterization system as described previously.

As depicted, in response to performing the first delay operation in step 635, a set signal is asserted to the re-settable latch (step 640). The set signal is output as the delayed intermediate signal from the single delay circuit 410 in FIG. 4. A system output signal is generated in response to the set signal (step 650). In response to the set signal, this system output signal is transitioned to a high state, i.e. is asserted. The assertion of the system output signal continues until the re-settable latch is reset.

When the Nth PWL performs its PWL operation (step 630), the Nth PWL asserts a reset signal to the re-settable latch (step 645). The reset signal causes the re-settable latch to reset to an initial state. In response to the resetting of the re-settable latch, the generated system output signal (step 650) is transitioned back to a low state, i.e. is de-asserted and the operation terminates.

Thus, the illustrative embodiments provide a mechanism for performing PWL output characterization while minimizing the chip area consumed by the mechanism and the power consumption of the mechanism. Such benefits are obtained through the elimination of all but one of the delay circuits in the PWL output characterization system and replacement of a logic OR gate with a re-settable switch. The same results are obtained as in the mechanism described in the '090 application but with the added benefits of smaller chip area and lower power consumption.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor. Moreover, the end products in which the integrated circuit chips may be provided may include game machines, game consoles, hand-held computing devices, personal digital assistants, communication devices, such as wireless telephones and the like, laptop computing devices, desktop computing devices, server computing devices, or any other computing device.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a pulse width limiter output characterization device, for determining a maximum pulse width of a pulse width limiter, comprising:
    receiving an input signal;
    limiting a pulse width of the received input signal to generate a first intermediate signal;
    delaying the first intermediate signal by a known amount to generate a set signal;
    asserting a clock output signal in response to assertion of the set signal; and
    de-asserting the clock output signal in response to a receipt of a reset signal, wherein the asserted clock output signal is representative of the maximum pulse width of the pulse width limiter,
    wherein the pulse width limiter output characterization device has a plurality of pulse width limiters arranged in series to thereby provide a series of pulse width limiters, and wherein a first pulse width limiter limits the pulse width of the received known clock signal to generate the first intermediate signal, and wherein a last pulse width limiter in the plurality of pulse width limiters outputs the reset signal.

2. The method of claim 1, wherein a delay circuit element associated with the first pulse width limiter delays the first intermediate signal by the known amount to generate the set signal.

3. The method of claim 2, wherein only the first pulse width limiter in the plurality of pulse width limiters has an associated delay circuit element.

4. The method of claim 1, wherein the known amount by which the intermediate signal is delayed is $(N-1)\tau$, where N is a number of pulse width limiters in the plurality of pulse width limiters, and $\tau$ is a fixed amount of time by which a rising edge of the input signal is delayed by the first pulse width limiter.

5. The method of claim 1, wherein each pulse width limiter in the plurality of pulse width limiters, with the exception of the last pulse width limiter, has an associated inverter that inverts an output of the associated pulse width limiter and provides the inverted output as an input to a next pulse width limiter in the series of pulse width limiters.

6. The method of claim 1, wherein the assertion of the clock output signal has a pulse width of $NT_{max}$, where N is a number of pulse width limiters in the plurality of pulse width limiters and $T_{max}$ is a maximum pulse width of the pulse width limiters.

7. The method of claim 6, further comprising:
determining a maximum pulse width for a pulse width limiter by dividing the pulse width of the asserted clock output signal by the number of pulse width limiters in the plurality of pulse width limiters.

8. The method of claim 1, wherein the clock signal is asserted by a re-settable latch in response to the re-settable latch receiving the set signal, and wherein the clock signal is de-asserted by the re-settable latch in response to receiving the reset signal.

9. A method, in a pulse width limiter output characterization device, for determining a maximum pulse width of a pulse width limiter, comprising:

receiving an input signal;

limiting a pulse width of the received input signal to generate a first intermediate signal;

delaying the first intermediate signal by a known amount to generate a set signal;

asserting a clock output signal in response to assertion of the set signal; and de-asserting the clock output signal in response to a receipt of a reset signal, wherein the asserted clock output signal is representative of the maximum pulse width of the pulse width limiter, wherein the clock signal is asserted by a re-settable latch in response to the re-settable latch receiving the set signal, and wherein the clock signal is de-asserted by the re-settable latch in response to receiving the reset signal.

10. The method of claim 9, wherein the re-settable latch is an edge triggered re-settable latch.

* * * * *